United States Patent
Kuisma

(10) Patent No.: US 10,418,962 B2
(45) Date of Patent: Sep. 17, 2019

(54) SYSTEM AND METHOD FOR RESONATOR AMPLITUDE CONTROL

(71) Applicant: MURATA MANUFACTURING CO., LTD., Nagaokakyo-shi, Kyoto (JP)

(72) Inventor: Heikki Kuisma, Helsinki (FI)

(73) Assignee: MURATA MANUFACTURING CO., LTD., Nagaokakyo-shi, Kyoto (JP)

( * ) Notice: Subject to any disclaimer, the term of this patent is extended or adjusted under 35 U.S.C. 154(b) by 80 days.

(21) Appl. No.: 15/874,259

(22) Filed: Jan. 18, 2018

(65) Prior Publication Data

US 2018/0226938 A1 Aug. 9, 2018

(30) Foreign Application Priority Data

Feb. 8, 2017 (FI) .................................. 20175108

(51) Int. Cl.
| | |
|---|---|
| *H03H 3/007* | (2006.01) |
| *G01C 19/5726* | (2012.01) |
| *G01C 19/5776* | (2012.01) |
| *H03H 9/24* | (2006.01) |

(Continued)

(52) U.S. Cl.
CPC ....... *H03H 3/0076* (2013.01); *G01C 19/5726* (2013.01); *G01C 19/5776* (2013.01); *G01R 33/0005* (2013.01); *G01R 33/0286* (2013.01); *H03H 9/2405* (2013.01)

(58) Field of Classification Search
CPC ............ G01C 19/5726; G01C 19/5776; H03H 3/0072
See application file for complete search history.

(56) References Cited

U.S. PATENT DOCUMENTS 5,783,973 A * 7/1998 Weinberg ............. G01C 19/574
331/116 M
8,375,789 B2 * 2/2013 Prandi ................ G01C 19/5726
73/504.04

(Continued)

FOREIGN PATENT DOCUMENTS

| EP | 2 360 448 A1 | 8/2011 |
| EP | 2360448 A1 | 8/2011 |
| JP | 2003121156 A | 4/2003 |

OTHER PUBLICATIONS

Finnish Search Report dated Nov. 14, 2017 corresponding to Finnish Patent Application No. 20175108.

(Continued)

*Primary Examiner* — Dean O Takaoka
*Assistant Examiner* — Alan Wong
(74) *Attorney, Agent, or Firm* — Squire Patton Boggs (US) LLP

(57) ABSTRACT

The present invention relates to a method and a device for stabilization of amplitude of a mechanical vibration of a mechanical resonator in a microelectromechanical sensor device. The method comprises exciting the mechanical resonator with an oscillating excitation force by an input transducer. The input transducer is driven with an input AC voltage having essentially constant amplitude at a frequency that deviates from the resonant frequency of the mechanical resonator by a first frequency difference. The first frequency difference is configured to stabilize the amplitude of the mechanical vibration.

20 Claims, 10 Drawing Sheets

(51) Int. Cl.
    *G01R 33/028*     (2006.01)
    *G01R 33/00*     (2006.01)

(56) References Cited

U.S. PATENT DOCUMENTS

| | | | | |
|---|---|---|---|---|
| 8,661,898 | B2* | 3/2014 | Watson | G01C 19/5691 |
| | | | | 73/504.08 |
| 8,763,459 | B2* | 7/2014 | Brand | G01C 19/5719 |
| | | | | 73/504.12 |
| 9,671,471 | B2* | 6/2017 | Langfelder | G01R 33/028 |
| 9,869,553 | B2* | 1/2018 | Boser | G01C 19/5776 |
| 2014/0144230 | A1 | 5/2014 | Magnoni et al. | |
| 2015/0035526 | A1 | 2/2015 | Langfelder et al. | |
| 2015/0276405 | A1 | 10/2015 | Rastegar et al. | |

OTHER PUBLICATIONS

Giacomo Langfelder et al., "Operation of Lorentz-Force Mems Magnetometers with a Frequency Offset Between Driving Current and Mechanical Resonance," IEEE Transactions on Magnetics, vol. 50, No. 1, Jan. 2014.

Jun. 13, 2018 Search Report issued in European Patent Application No. 18151179.

* cited by examiner

SYSTEM AND METHOD FOR RESONATOR AMPLITUDE CONTROL

BACKGROUND

Field

The present invention relates to a method and a system for driving a microelectromechanical (MEMS) device. More particularly, the invention relates to a method and a microelectromechanical sensor device comprising a mechanical resonator and a drive loop circuitry for stabilizing amplitude of a mechanical vibration of the mechanical resonator.

Micro-Electro-Mechanical Systems, or MEMS can be defined as miniaturized mechanical and electro-mechanical systems where at least some elements have a mechanical functionality. Since MEMS devices are created with the same or similar tools used to create integrated circuits, micromachines and microelectronics can be fabricated on the same piece of silicon.

MEMS structures can be applied to quickly and accurately detect very small changes in physical properties. For example, a microelectronic gyroscope can be applied to quickly and accurately detect very small angular displacements.

Motion has six degrees of freedom: translations in three orthogonal directions and rotation around three orthogonal axes. The latter can be measured by an angular rate sensor, also known as gyroscope.

Gyroscope is a device for detection angular velocity. In a MEMS gyroscope, mechanical oscillation is used as the primary motion. When an oscillating gyroscope is subjected to an angular motion orthogonal to the direction of the primary motion, an undulating Coriolis force results that is proportional to the angular velocity of the angular motion and to the velocity of the primary motion, and has thus a $\pi/2$ phase shift to the primary motion. This creates a secondary oscillation, also referred to as the sense mode or the detection motion, orthogonal to the primary motion and to the axis of the angular motion, and at the frequency of the primary oscillation. The amplitude of this coupled oscillation can be used as the measure of the angular rate, which term may refer to the absolute value of an angular velocity.

In induction type magnetometers, a suspended coil is placed in a magnetic field and made to periodically oscillate around a selected axis. Due to the electromagnetic induction a voltage is generated in the coil. The amount of the voltage is proportional to the magnetic field change through the coil due to angular oscillation and can be used as a measure of the magnetic field.

DESCRIPTION OF THE RELATED ART

The term resonator refers to a mechanical resonator that is excited to an oscillation motion with an input transducer. The input transducer is a functional element, which may be a separate element, or part of the resonator structure. A primary resonator of a conventional MEMS gyroscope or a coil resonator of an induction type magnetometer is excited with a force oscillating at the resonant frequency of the resonator. For simplicity, this kind of conventional driving of a resonator at the resonant frequency may also be called resonance drive. A MEMS device, for example a gyroscope, may also comprise at least one secondary resonator in the MEMS part of the device. In the following description, term resonator may refer to a primary resonator of a gyroscope and to a single resonator of microelectromechanical sensor devices that only have a single resonator. If no amplitude control is applied, the mechanical vibration amplitude of the resonator will rise and approach a steady state value determined by the exciting force and mechanical dissipation in the resonator, which is often characterized by the quality factor, also called as the Q-value. An example of an envelope curve of amplitude rise of an oscillating resonator is illustrated in FIG. 1. The vibration amplitude starts from zero in the beginning and slowly approaches a steady state with stable amplitude. In this example, reaching the steady state takes more than 12 000 oscillation cycles.

In a practical gyroscope and/or in a practical induction type magnetometer, the resonator oscillation amplitude is actively limited to a value less than the maximum possible. One important reason for this is that the free running amplitude would be too sensitive to changes in the Q-value. If the Q-value drops for example 30%, the oscillation amplitude also drops 30%. Further, the maximum exciting force towards the mechanical resonator generated by an input transducer is typically designed according to a relatively strict rise time requirement, so that start-up phase of the MEMS device resonator is not unnecessarily extended. This usually results in a higher exciting force that would be required to achieve the intended amplitude over a longer rise time.

Amplitude limitation and control can be realized with an automatic gain control arrangement, where the motion of the resonator is sensed by an amplitude detector and stabilized to the desired value by applying a negative feed-back to an automatic gain control (AGC) amplifier via a controller unit. An example of a traditional AGC based feedback arrangement for driving a MEMS resonator is illustrated in FIG. 2. An oscillator 90 provides a stable electrical oscillation signal in an input of an AGC amplifier 95. A controller 270 controls the gain of the AGC amplifier 95 based on an output amplitude value indicated by an output transducer 120, which output amplitude value is detected with an amplitude detector 280. The output transducer is a functional element, which may be a separate physical element, or part of the resonator structure. FIG. 3 illustrates an envelope of the vibration amplitude of the resonator in the circuitry of FIG. 2, when amplitude control is applied to limit the maximum amplitude to +/−2 arbitrary units. The amplitude control function starts limiting the amplitude after a few hundred oscillation cycles have occurred, when the amplitude reaches the intended value, after which the amplitude remains steady.

One problem in a practical MEMS sensor is that the ratio between the large amplitude input AC signal needed for driving the mechanical resonator and a small amplitude signal produced by the Coriolis force or the induction may have the same frequency. These signals need, however, to be strictly separated for proper operation of the sensor device. FIG. 4 illustrates a so called capacitive coupling problem in a MEMS gyroscope device. In a MEMS gyroscope, the mechanical resonator part comprises two resonators, a primary resonator 100a and a secondary resonator 100b. The capacitive coupling effect is illustrated with a capacitor 250 coupled between the input transducer 110 and the secondary output transducer 120b. In addition to the wanted output signal provided at the output of the secondary output transducer 120b, an amount of unwanted capacitively coupled signal is included in the signal received from this output, which may cause the detection result to be erroneous. Therefore, unwanted capacitive coupling from the input transducer 110 of the primary resonator 100a to the output transducer 120b of the secondary resonator 100b should preferably be minimized.

Capacitive coupling can be minimized to a certain level for example by designing the capacitance from the input of a primary transducer to the output of the secondary transducer as small as possible. Further, the primary input or secondary output or both may have a differential configuration and by perfect symmetry of the layouts of the MEMS part, interconnections and the interface circuit, the coupling can be made to become zero. A fully optimal design may not be possible in practice due to size and/or cost constraints or manufacturing tolerances. Thus, complete isolation is not in practice possible without adjustment and/or calibration of each device individually, which is not economical. The remaining part of the capacitive coupling that cannot be removed by design may be called capacitive coupling, or remaining capacitive coupling. One major problem is that capacitive coupling varies over time and temperature, and this variation cannot easily be separated from the variation of the Coriolis-force induced signal. In a conventional AGC-method the amount of capacitively coupled signal follows the Q-value variation of the resonator, which variation may be in the order of 50% over the allowed temperature range.

For reducing effects of the remaining capacitive coupling, two conditions are preferred. A first condition is that capacitive coupling should remain constant irrespective of variation in the Q-value. It has been found in practice that even a higher amount of constant capacitive coupling is easier to cope with than a small but greatly variable capacitive coupling. A constant amount of error is likely easier to be taken into account in detection electronics, for example. A second condition is that the capacitively coupled signal should be at quadrature phase with respect to the Coriolis force induced electrical signal. As known in the art, quadrature phase indicates a phase shift of $\pi/2 \pm n^*\pi$, where n is an integer. When the capacitive coupling, in other words the capacitively coupled signal, has quadrature phase with respect to the Coriolis force or electromagnetic induction generated signals, it may be filtered out by phase sensitive detection of the Coriolis signal or the electromagnetically induced signal.

In a conventional gyroscope, the latter of the above conditions is not met, since the resonator will cause a $-\pi/2$ phase shift and the Coriolis-effect will cause a $+\pi/2$ phase shift, and the total phase shift is thus 0. Capacitive coupling to a capacitive load does not cause a phase shift. Therefore, the capacitively coupled signal is in-phase $(0 \pm n^*\pi)$ with the Coriolis signal. The secondary resonator causes a $-\pi/2$ phase shift only if the primary and secondary resonators of a gyroscope have an exact frequency match, which can only be achieved by active frequency control. In such a rare case, an additional $-\pi/2$ phase shift is produced, and the capacitively coupled signal will be in quadrature phase with the Coriolis signal. For the purpose of this invention, it is assumed that exact frequency matching is not used and thus in a conventional gyroscope the capacitive coupling will cause an in-phase signal.

As an example of a conventional gyroscope, the patent application EP 2360448 A1 discloses a system for generating the mechanical oscillation and stabilizing the oscillation amplitude is disclosed where a feed-back type oscillator is used for sustaining the oscillation and automatically generating an oscillation frequency close to the resonant frequency of the MEMS resonator. A variable gain amplifier is used to adjust the drive AC-voltage according to a control voltage produced by a controller in order to maintain the mechanical oscillation amplitude stable while the Q-value of the resonator may be changing. This varying AC-drive voltage will cause a variable capacitive cross coupling according to the Q-value variation.

In the patent application US20150276405 A1 a system for generating the oscillation and stabilizing the oscillation amplitude is disclosed where a feed-back type oscillator is used for sustaining the oscillation and automatically generating an oscillation frequency close to the resonant frequency of the MEMS resonator. A HV driver is provided for generating a variable high-level AC-voltage from a variable control voltage produced by a PID controller and a charge pump. The variable AC-drive voltage will cause a variable capacitive cross coupling according to Q-value variation.

The first condition above may be achieved, and it is often implemented in a conventional gyroscope with electrostatic transducers by applying an amplitude stabilizing negative feed-back to control a DC bias voltage. In an exemplary prior art solution illustrated in FIG. 5, the DC bias voltage is provided to the input transducer by using an amplifier 260. The DC bias voltage level received from the amplifier 260 is controlled by a controller 270 based on detected amplitude of the output AC-signal of the output transducer 120 that is detected with an amplitude detector 280. The DC bias voltage is summed with an AC voltage signal with a constant oscillation amplitude from an oscillator 290 oscillating at the resonant frequency of the resonator 100, and the combined AC and DC voltage is fed towards the input transducer 110.

The solution of FIG. 5 suits well for MEMS devices with capacitive transducers, but is however not feasible with a MEMS device using piezo-electric transducers, since no DC bias voltage is usually applied to a piezoelectric device. Mere AC voltage is sufficient for generating force in a piezoelectric transducer due to internal constant polarization of the piezo-electric material, and the amount of force generated by the piezoelectric device by a given AC-voltage cannot be changed with an additional DC voltage. An amplitude stabilization method and device is needed, which may be used with any type of MEMS devices with electrically excited resonators, including MEMS devices utilizing piezo-electric transducers for exciting resonators.

SUMMARY

An object is to provide a method and apparatus to solve at least the problems of prior art disclosed above. The objects of the present invention are achieved with a method according to the claims. The objects of the present invention are further achieved with a microelectromechanical sensor according to the claims.

The preferred embodiments of the invention are disclosed in the dependent claims.

The present invention is based on an idea of producing the excitation force (a.k.a. drive force) for exciting a mechanical resonator with a transducer driven with an essentially constant amplitude input AC voltage having a frequency that is offset from the resonant frequency of the mechanical resonator. In connection to the description of the embodiments of the invention, the term input AC voltage refers to an AC voltage having an essentially constant oscillation amplitude. Essentially constant means that some change of the amplitude is possible for example due to secondary causes affecting properties of the driving stage of the oscillator and/or an amplifier. However, the amplitude of the input AC voltage is not actively adjusted for stabilizing the amplitude of the mechanical oscillation. Compared to resonant frequency drive, dependence of the input AC voltage amplitude from the Q-value of the mechanical resonator is greatly reduced so that the amplitude of the input AC voltage may be kept and considered essentially constant. Vibration of the mechanical resonator is excited with an alternating force, the frequency of which deviates from the resonant frequency of the mechanical resonator. Amplitude of the vibration may be adjusted by adjusting the frequency of the excitation force and especially by adjusting a frequency difference of the excitation force from that of the resonant frequency of the mechanical resonator. Amplitude adjustment may be accomplished with a feed-back loop circuitry and a controller circuitry that keeps the amplitude of the oscillation of the mechanical resonator at a desired constant value. The mechanical force for exciting the mechanical oscillator may be generated by an input transducer device, that is driven at the wanted frequency offset from the resonant frequency of the mechanical resonator using an essentially constant amplitude input AC voltage. In other words, the oscillation amplitude of the input AC voltage remains essentially constant at all times, and the frequency offset of the input AC voltage is controlled to stabilize the amplitude of the mechanical oscillation. The essentially constant amplitude of the input AC voltage ensures an essentially constant amount of capacitive coupling of the input AC voltage to the detection signal, so that the capacitively coupled unwanted signal may be relatively easily compensated or removed from the detection signal.

In the feed-back loop, the phase difference between the driving input AC voltage causing the excitation force and the detected vibration waveform received from the mechanical resonator may be used as an intermediate controlled parameter for limiting the possible excitation frequencies to either below or above the resonant frequency.

According to a first aspect, a method for stabilizing amplitude of a mechanical vibration of a mechanical resonator in a microelectromechanical sensor device is provided. The method comprises exciting the mechanical resonator into the mechanical vibration with an oscillating excitation force by an input transducer and driving the input transducer with an input AC voltage having an essentially constant amplitude, wherein the driving with the input AC voltage occurs at a frequency that deviates from the resonant frequency of the mechanical resonator by a first frequency difference. The first frequency difference is configured to stabilize the amplitude of the mechanical vibration.

According to a second aspect, the method further comprises causing the stabilizing by maintaining the amplitude of the mechanical vibration essentially at a pre-defined constant value by adjusting the first frequency difference.

According to a third aspect, the method further comprises providing an output AC voltage induced by the mechanical vibration and controlling the adjusting the first frequency difference on the basis of a detected amplitude difference between a detected amplitude of the output AC voltage and a preset target amplitude value.

According to a fourth aspect, the method further comprises detecting a first phase difference between the input AC voltage and the output AC voltage. The input AC voltage is configured to induce the oscillating excitation force towards the mechanical resonator. The first frequency difference is controlled on the basis of the first phase difference.

According to a fifth aspect, the method further comprises causing a phase shift to the output AC voltage, wherein the phase shift produces a phase shifted output AC voltage.

According to a sixth aspect, the method further comprises detecting a second phase difference between the phase shifted output AC voltage and the input AC voltage and controlling of the first frequency difference on the basis the second phase difference.

According to a seventh aspect, the method comprises generating the input AC voltage by amplifying the phase shifted output AC voltage.

According to an eighth aspect, the method comprises generating the input AC voltage by a voltage controlled oscillator.

According to a ninth aspect, the microelectromechanical sensor device comprises any one of a gyroscope and an induction type magnetometer.

According to a tenth aspect, the first frequency difference is between +/−0.0001 and +/−0.001 times the resonant frequency.

According to a first apparatus aspect, a microelectromechanical sensor device is provided, comprising a mechanical resonator and a drive loop circuitry for stabilizing amplitude of a mechanical vibration of the mechanical resonator. The microelectromechanical sensor device comprises an input transducer configured to excite the mechanical resonator into the mechanical vibration with an oscillating excitation force. The drive loop circuitry is configured to drive the input transducer with an input AC voltage having an essentially constant amplitude, wherein the driving with the input AC voltage is configured to occur at a frequency that deviates from a resonant frequency of the mechanical resonator by a first frequency difference. The first frequency difference is configured to stabilize the amplitude of the mechanical vibration.

According to a second apparatus aspect, the drive loop circuitry further comprises a feed-back circuitry configured to cause the stabilizing by maintaining the amplitude of the mechanical vibration of the mechanical resonator at a desired constant value by adjusting the first frequency difference.

According to a third apparatus aspect, the microelectromechanical sensor device further comprises an output transducer configured to provide an output AC voltage induced by the mechanical vibration, and the feed-back circuitry comprises an amplitude control circuitry configured to control the adjusting the first frequency difference on the basis of a detected amplitude of the output AC voltage and a preset target amplitude value.

According to a fourth apparatus aspect the feed-back circuitry further comprises a phase detecting circuitry configured to detect a first phase difference between the input AC voltage and the output AC voltage. The input AC voltage is configured to induce the oscillating excitation force towards the mechanical resonator. A controller circuitry configured to control the first frequency difference on the basis of the first phase difference.

According to a fifth apparatus aspect, the amplitude control circuitry is configured to cause a phase shift to the output AC voltage, wherein the phase shift produces a phase shifted output AC voltage.

According to a sixth apparatus aspect the feed-back circuitry further comprises a phase detecting circuitry configured to detect a second phase difference between the phase shifted input AC voltage and the output AC voltage, and a PLL controller circuitry configured to control the adjustment of the first frequency difference on the basis of the second phase difference.

According to a seventh apparatus aspect, the drive loop circuitry comprises an amplifier configured to generate the input AC voltage by amplifying the phase shifted output AC voltage.

According to an eighth apparatus aspect, the drive loop circuitry comprises a voltage controlled oscillator configured to generate said input AC voltage.

According to a ninth apparatus aspect, the microelectromechanical sensor device is any one of a gyroscope and an induction type magnetometer.

According to a tenth apparatus aspect, the first frequency difference is between +/−0.0001 and +/−0.001 times the resonant frequency.

The present invention has an advantage that the input AC voltage needed to drive the input transducer of the mechanical resonator for exciting the mechanical resonator into a stable mechanical oscillation is essentially independent of the Q-value of the mechanical resonator or any other factor changing the relation between the oscillation amplitude of the resonator and the needed input AC voltage. In other words, the needed input AC voltage of a stabilized system only weakly depends on the Q-value of the mechanical resonator. By applying the disclosed method, the amplitude of the mechanical oscillation can be beneficially kept essentially at the desired constant value even when the Q-value or other parameters affecting the excitation force required for maintaining a constant oscillation amplitude change, for example, due to a change in the environment, due to mechanical or electrical disturbance, due to aging of the components of any other similar reason. Embodiments of the invention disclose circuitries to implement a drive loop of a mechanical resonator that utilize this inventive principle.

The present invention is particularly useful in MEMS sensor devices in which a mechanical vibration needs to be induced that has a stable amplitude, but which do not require extreme stability of the vibration frequency. As mentioned above, examples of such MEMS sensors are a gyroscope and an induction type magnetometer, but the invention is equally applicable to any other type of MEMS device where mechanical vibration is needed with stable amplitude. For the sake of clarity, the well-known Lorentz-force magnetometer must be excluded from the possible applications of the novel method and apparatus. In a Lorentz-force magnetometer the mechanical oscillation amplitude is detected, and its value is used as the output quantity and no stabilization of the amplitude is used. Thus, stabilizing the oscillation would practically impair the device.

BRIEF DESCRIPTION OF THE DRAWINGS

In the following the invention will be described in greater detail, in connection with preferred embodiments, with reference to the attached drawings, in which.

DETAILED DESCRIPTION

The following embodiments are exemplary. Although the specification may refer to "an", "one", or "some" embodiment(s), this does not necessarily mean that each such reference is to the same embodiment(s), or that the feature only applies to a single embodiment. Single features of different embodiments may be combined to provide further embodiments.

As used in this application, the term "circuitry" refers to all of the following: (a) hardware-only circuit implementations, such as implementations in only analog and/or digital circuitry, wherein the circuitry may comprise discrete and/or integrated components, and (b) combinations of circuits and software (and/or firmware), such as (as applicable): (i) a combination of processor(s) or (ii) portions of processor(s)/software including digital signal processor(s), software, and memory(ies) that work together to cause an apparatus to perform various functions, and (c) circuits, such as a microprocessor(s) or a portion of a microprocessor(s), that require software or firmware for operation, even if the software or firmware is not physically present.

This definition of "circuitry" applies to all uses of this term in this application, including use of discrete and integrated electronic circuitry and any combination thereof. As a further example, as used in this application, the term "circuitry" would also cover an implementation of merely a processor for multiple processors, or a portion of a processor and its (or their) accompanying software and/or firmware. The term "circuitry" would apply to one or more application specific integrated circuit ASIC(s) or applications processor integrated circuit(s) for a microelectronic sensor device or system. Terms "controller", "detector" and "shifter" refer to circuitry configured for a specific task.

Figure 6:
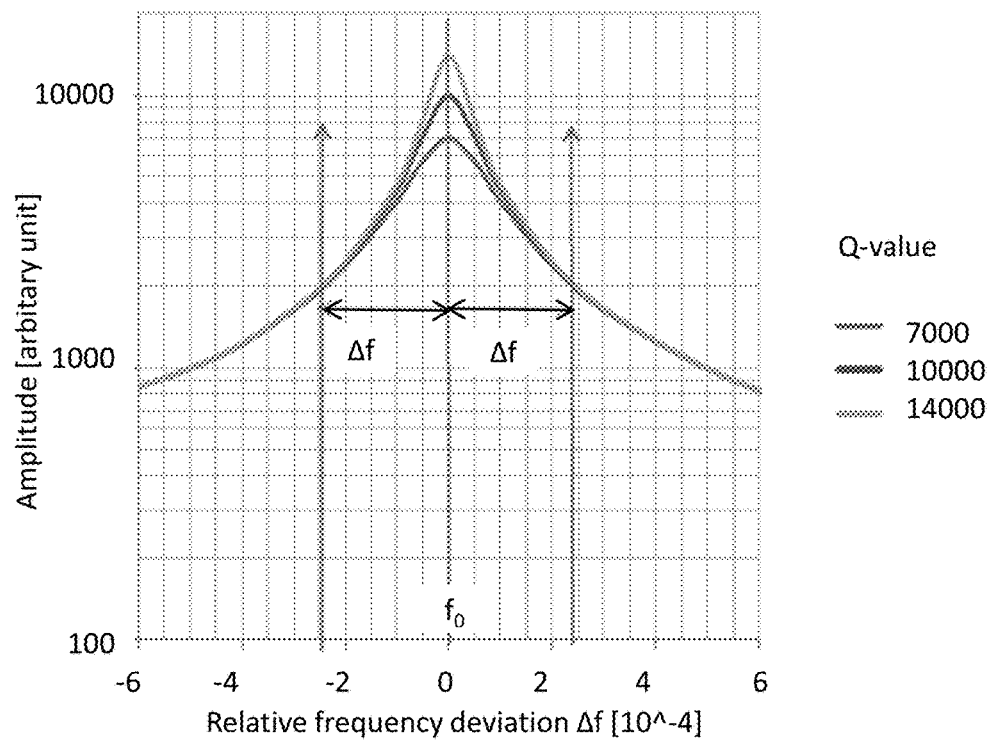
FIG. 6 is an illustration of frequency responses of resonators with different Q-values.

The first condition, independence of the stable resonance amplitude from Q-value of the resonator, may be achieved by introducing to the driving input AC voltage a frequency difference $\Delta f$ from the resonant frequency $f_0$ of the mechanical resonator. The FIG. 6 shows an exemplary force to amplitude frequency response of a mechanical resonator at frequencies close to the resonant frequency $f_0$. Three different responses of devices with three different Q-values are illustrated. At the resonant frequency $f_0$ of the mechanical resonator, amplitude varies significantly depending on the Q-value. Thus, exciting mechanical resonators with such different Q-values into oscillations with equal amplitudes would require using significantly different amplitude input AC voltages. However, it can be noticed that at frequencies deviating from the resonant frequency by a frequency difference $\Delta f$, the amplitude responses of mechanical resonators become practically independent of the Q-values. In other words, when the input transducers of mechanical resonators are driven by an essentially constant amplitude input AC voltage having a frequency deviating by $\Delta f$ from the resonant frequency $f_0$, the steady state of the resonance of mechanical resonators with different Q-values depend essentially on the frequency difference $\Delta f$, but are essentially independent on the Q-values of the mechanical resonators. The frequency difference $\Delta f$ may be achieved by decreasing or increasing the frequency of the input AC voltage from the resonant frequency $f_0$.

In the following analysis, the input AC voltage is assumed to have a frequency difference to the mechanical resonant frequency of the resonator. The amplitude of the input AC voltage is variable in order to adjust the mechanical oscillation amplitude to a constant desired level. As illustrated in FIG. 6, in order to stabilize the amplitude of the mechanical resonator to an exemplary value of 2000 arbitrary amplitude units, the frequency difference $\Delta f$ may be selected either above or below the resonant frequency $f_0$. In an exemplary embodiment, the frequency difference $\Delta f$ may be set to +/−0.000245 times the resonant frequency $f_0$. If the resonant frequency $f_0$ equals for example 20 kHz, the frequency difference $\Delta f$ of approximately 4.9 Hz causes the resonator to be excited into a resonance oscillation with an amplitude of approximately 2000 arbitrary units. Variation of the amplitude between a resonator with Q-value of 14000 and a resonator with Q-value of 7000 is approximately 80 arbitrary units, which corresponds to just 4% of the resonator amplitude. The absolute input voltage needed at this frequency difference is 5 times larger than when driving at the resonant frequency. Resonance gain at the frequency with this frequency difference $\Delta f$ is 2000, which is one fifth of the resonance gain of 10 000 at the resonant frequency $f_0$. Thus, the maximum absolute amplitude variation of the required variable input AC voltage for driving oscillation with constant amplitude at a frequency that is offset from the resonant frequency $f_0$ by this exemplary frequency difference $\Delta f$ is in level of 5 times 4%=20% of the corresponding amplitude variation of the required variable input AC voltage needed for driving oscillation with constant amplitude with resonance frequency drive. In another exemplary embodiment, the frequency difference $\Delta f$ may be set to +/−0.000498 times the resonant frequency $f_0$. If the resonant frequency $f_0$ equals the same exemplary 20 kHz, the frequency difference $\Delta f$ is approximately 10 Hz, and the variation of the mechanical oscillation amplitude between a resonator with Q-value of 14000 and a resonator with Q-value of 7000 is just 8 arbitrary units, which corresponds to just 0.8% of the resonator oscillation amplitude. The absolute input voltage needed at this frequency difference is 10 times larger than when driving at the resonant frequency $f_0$. Resonance gain at the frequency with this exemplary frequency difference $\Delta f$ is 1000, while the resonance gain at the resonant frequency is 10 000. The maximum absolute amplitude variation of the required variable input AC voltage for driving a mechanical oscillation with constant amplitude at a frequency that is offset from the resonant frequency $f_0$ by this exemplary frequency difference $\Delta f$ is in level of 10 times 0.8%=8% of the corresponding amplitude variation needed at resonance frequency drive. Thus, it can be noticed that the larger the frequency difference $\Delta f$, the smaller the effect of the Q-value on the required input AC-voltage amplitude or, if the input AC voltage amplitude is kept constant, on the mechanical oscillation amplitude. Preferably, the frequency difference $\Delta f$ is between +/−0.0001 and +/−0.001 times the resonant frequency $f_0$.

Figure 7:
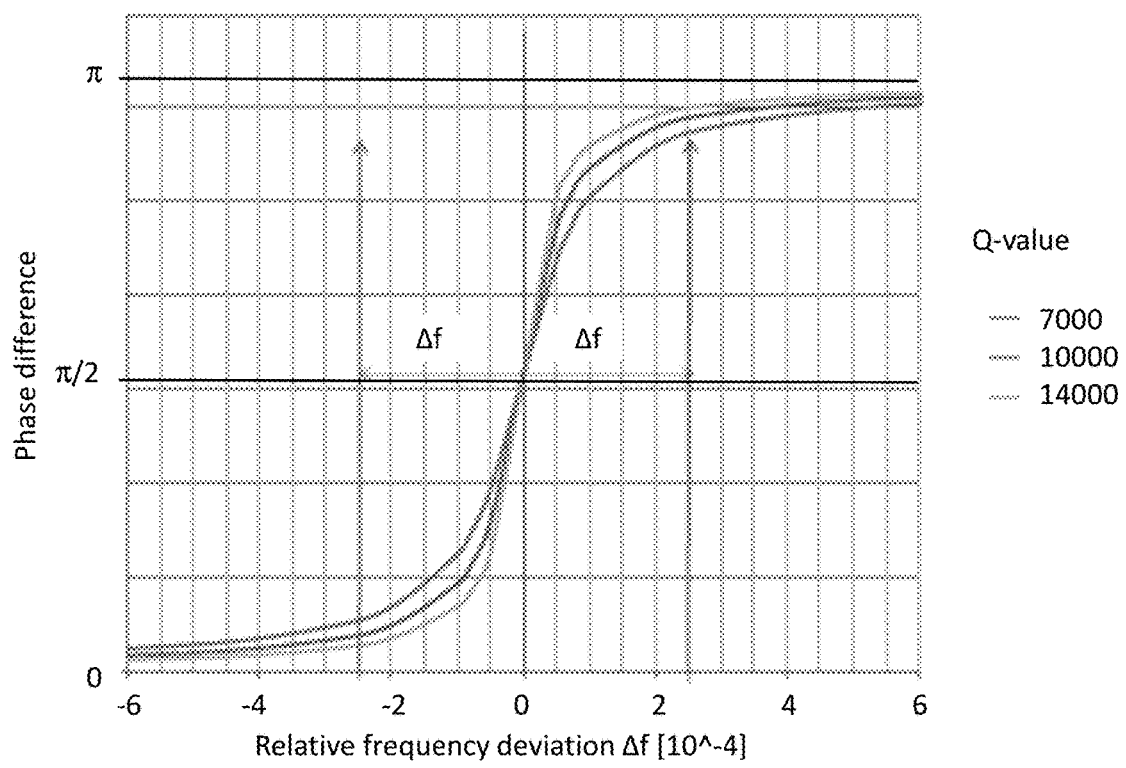
FIG. 7 illustrates phase difference as a function of relative frequency deviation.

The second condition is that the phase of the capacitively coupled voltage should preferably be in quadrature phase relative to the Coriolis-force induced voltage at the output transducer of the secondary resonator. This condition is also met with the frequency difference $\Delta f$ stabilization method. FIG. 7 shows the phase of the input AC voltage with respect to the mechanical oscillation of the resonator. With large or moderate frequency difference $\Delta f$ values the input AC voltage has either close to 0 or close to $\pi(180°)$ phase relation to the mechanical resonator oscillation phase. This means that the input AC voltage is close to quadrature relation to the Coriolis-force induced output voltage since the Coriolis-force is in quadrature phase with respect to the mechanical oscillation.

Figure 8A:
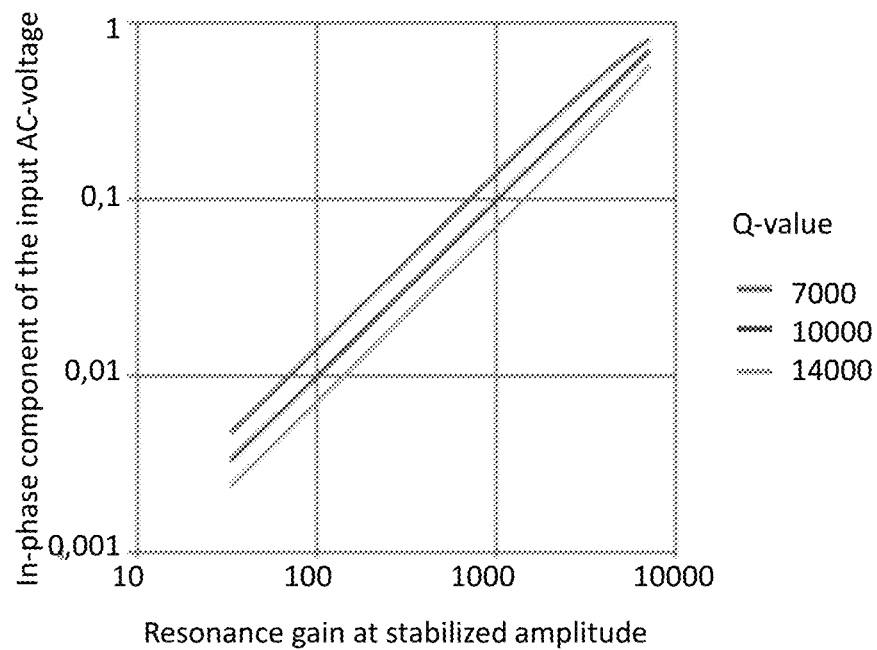
FIG. 8a illustrates in-phase component of input AC-voltage as function of resonance gain.
Figure 8B:
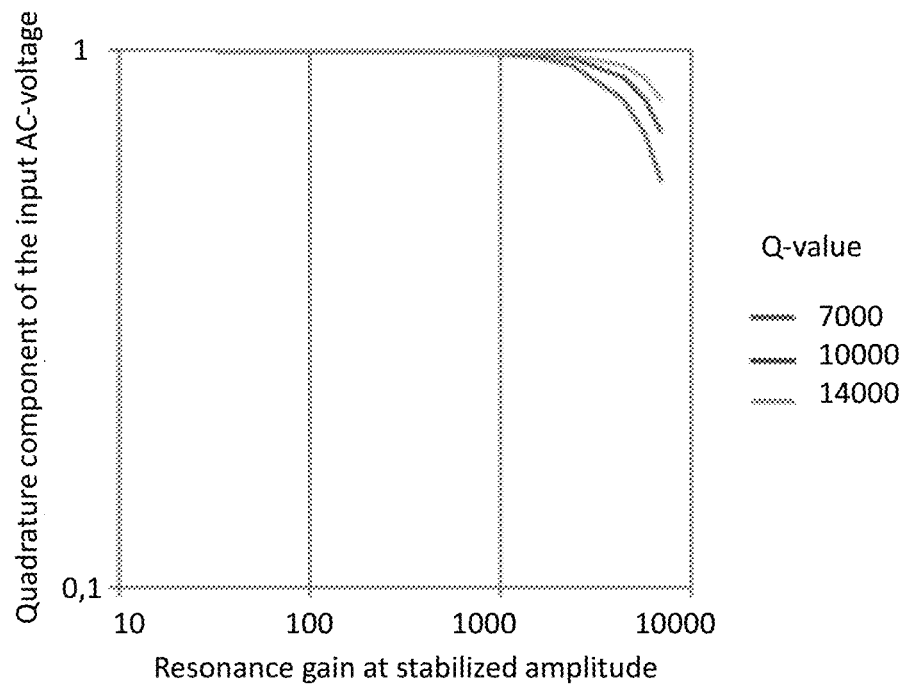
FIG. 8b illustrates out-of-phase component of input AC-voltage as function of resonance gain.

Some in-phase component also exists, as illustrated in FIGS. 8a and 8b. FIG. 8a illustrates in-phase component of the input AC-voltage as function of resonance gain at stabilized amplitude. In-phase component varies slightly depending on the Q-value, as indicated by the three exemplary plots for different Q-values. For example, FIG. 8a shows that in an exemplary device with Q-value of 10000, at resonance gain of 100, the in-phase component is just 0.01, in other words 1% of the input AC voltage, and share of the in-phase component rises steadily to level of 10% when the resonance gain rises to level of 1000. FIG. 8b illustrates share of the quadrature component of the input AC-voltage. Although on very high resonance gain values dependency can be seen between different Q-values, share of the quadrature phase component of the input AC voltage remains essentially stable essentially at level of 100% (1) at any resonance gain value below 1000, independent of the Q-value. Thus, the unwanted in-phase component is orders of magnitude smaller than the wanted quadrature phase component. The in-phase component depends on the frequency difference $\Delta f$, and also on the Q-value.

Combining the effects of the two desirable conditions at resonance gain 1000 and Q-value 10 000 we find that the total change of the in-phase component of the capacitively coupled signal due to Q-value variation is only 0.8% of the variation found in the conventional resonance drive case (8% multiplied by 10%). At resonance gain 2000 the coupled in-phase signal is 4% and at gain 500 it is 0.2% of the conventional coupled signal. This analysis proofs that by driving the input transducer at a frequency difference to the resonant frequency, the input AC voltage amplitude will, compared to the resonant frequency drive, have a greatly reduced dependency on the Q-value variation of the resonator and thus the input AC voltage amplitude will be essentially constant.

Let us next have a look at a transient response of the mechanical oscillation amplitude, when the input AC voltage has been switched on at time=0, and simulate the amplitude rise towards a steady state where the oscillation amplitude is essentially stable. For a practical MEMS sensor application, it is important to confirm that no detrimental side effects will arise during switch-on or due to other possible transients during the steady state operation of the MEMS device operation.

Figure 1:
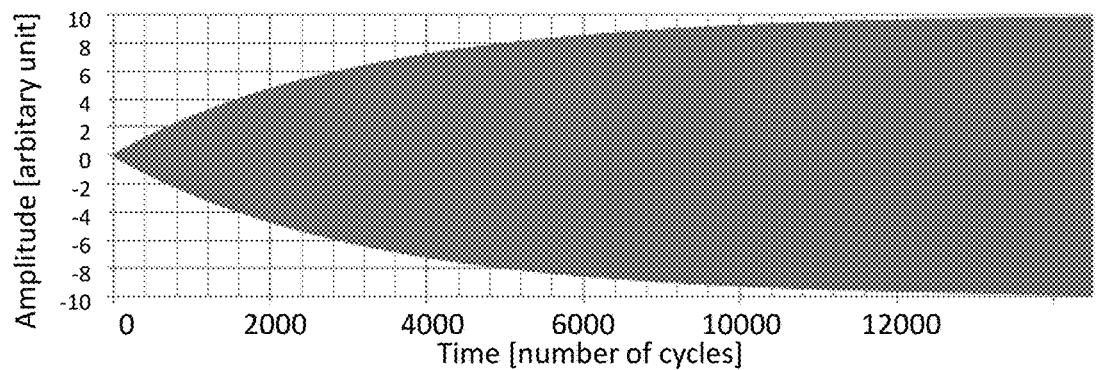
FIG. 1 is an illustration of an envelope curve of amplitude rise of an oscillating resonator.
Figure 3:
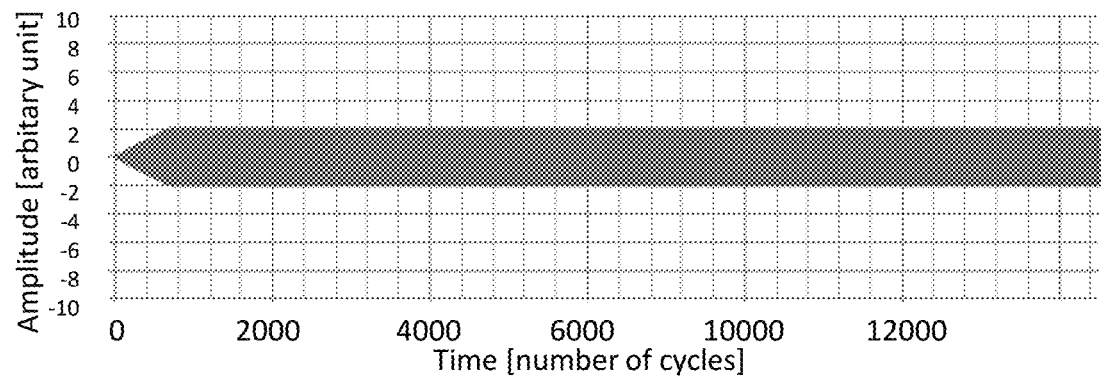
FIG. 3 is an illustration of an envelope curve of amplitude rise of an oscillating resonator with AGC.
Figure 9:
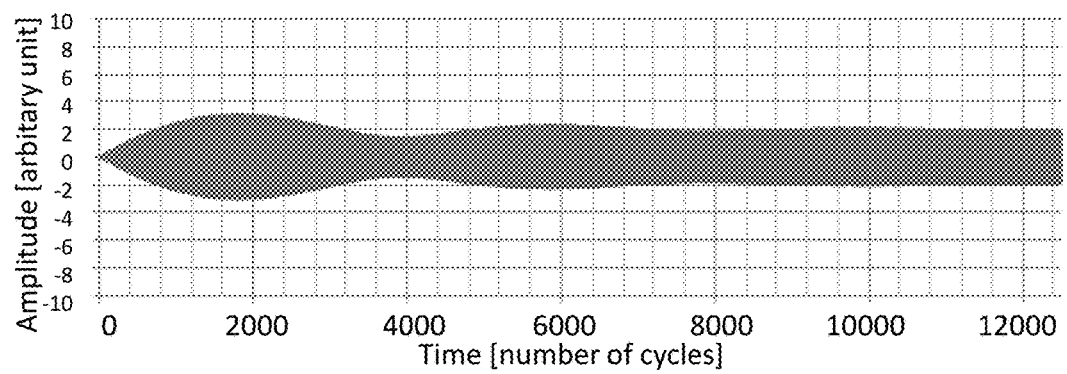
FIG. 9 is a first illustration of a transient response envelope curve.
Figure 10:
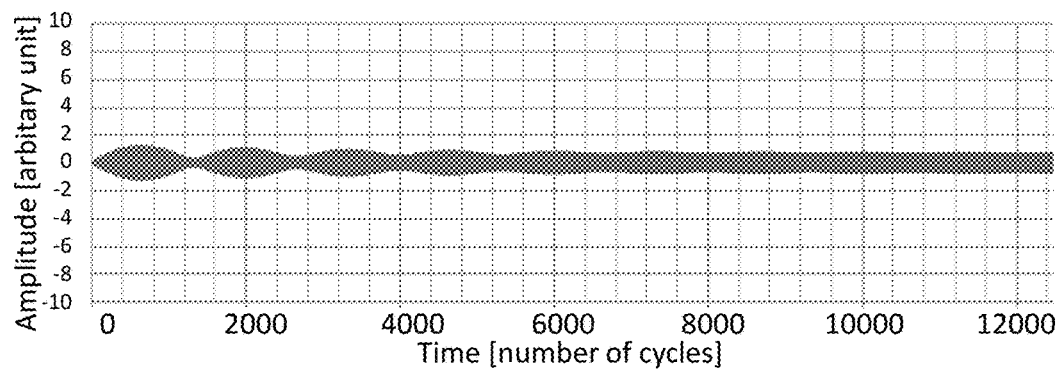
FIG. 10 is a second illustration of a transient response envelope curve.
Figure 11:
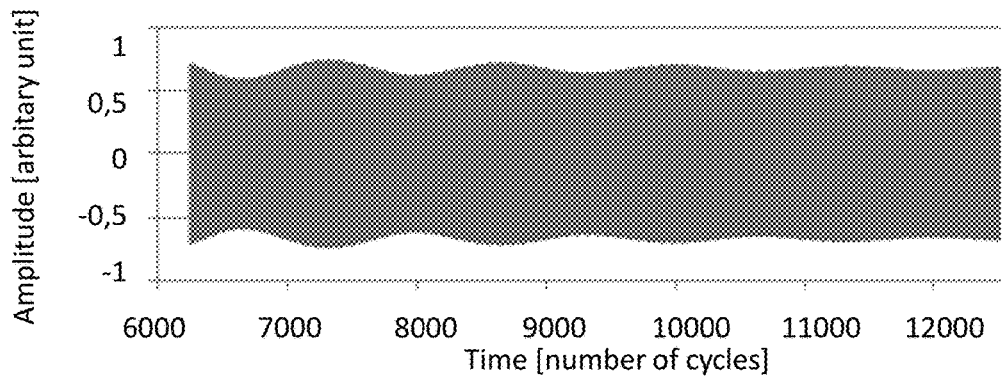
FIG. 11 is a magnification of part of envelope curve of FIG. 10.
Figure 12:
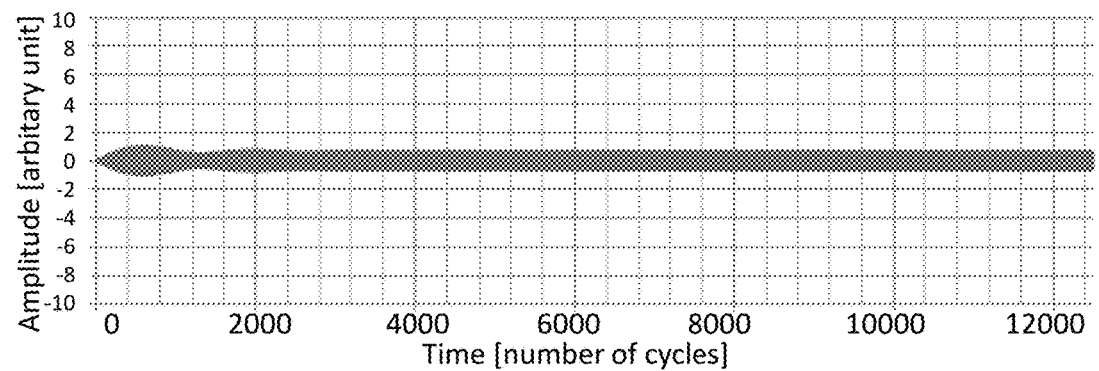
FIG. 12 is a third illustration of a transient response envelope curve.
Figure 13:
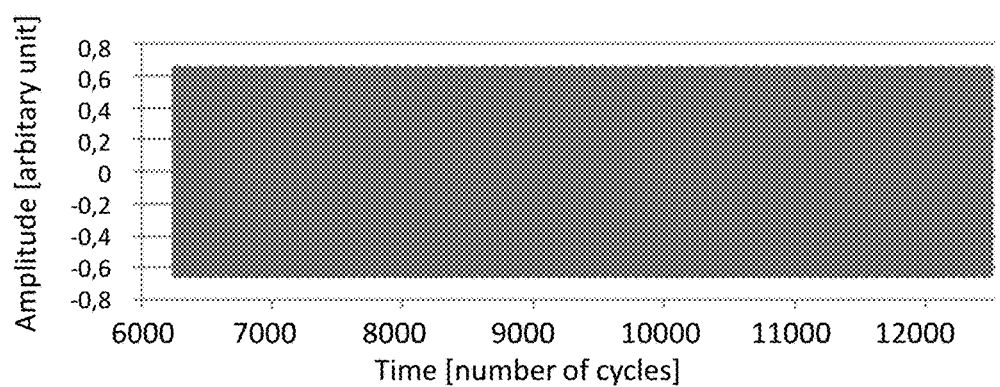
FIG. 13 is a magnification of part of envelope curve of FIG. 12.

FIG. 9 illustrates a transient response for a resonator, when the input transducer is driven with an essentially constant amplitude input AC voltage at relative frequency difference $\Delta f$=0.0025 and Q-value 10000 over a number of oscillation cycles of the mechanical resonator. FIG. 10 illustrates a transient response for a resonator, when the input transducer is driven with an input AC voltage at relative frequency difference Δf=0.0075 and Q-value 10000. FIGS. 9 and 10 show that rise-time of the amplitude with frequency difference Δf driving is as fast as with resonance excitation shown in FIGS. 1 and 3, and in the steady state the amplitude approaches to that predicted by FIG. 6. FIGS. 10 and 11 show however, that some fluctuation of the amplitude takes place around the steady state value over time. FIG. 11 shows a magnification of the tail of the amplitude envelope curve of FIG. 10, and it shows that this fluctuation will continue in small scale for thousands of cycles. If the Q-value is decreased to 3000, this fluctuation can be decreased as shown in FIG. 12, and further in FIG. 13 that shows a magnification of the tail of the amplitude envelope curve of FIG. 12. However, this decrease of fluctuation by decreasing the Q-value is done at cost of increasing capacitive coupling variation.

Figure 2:
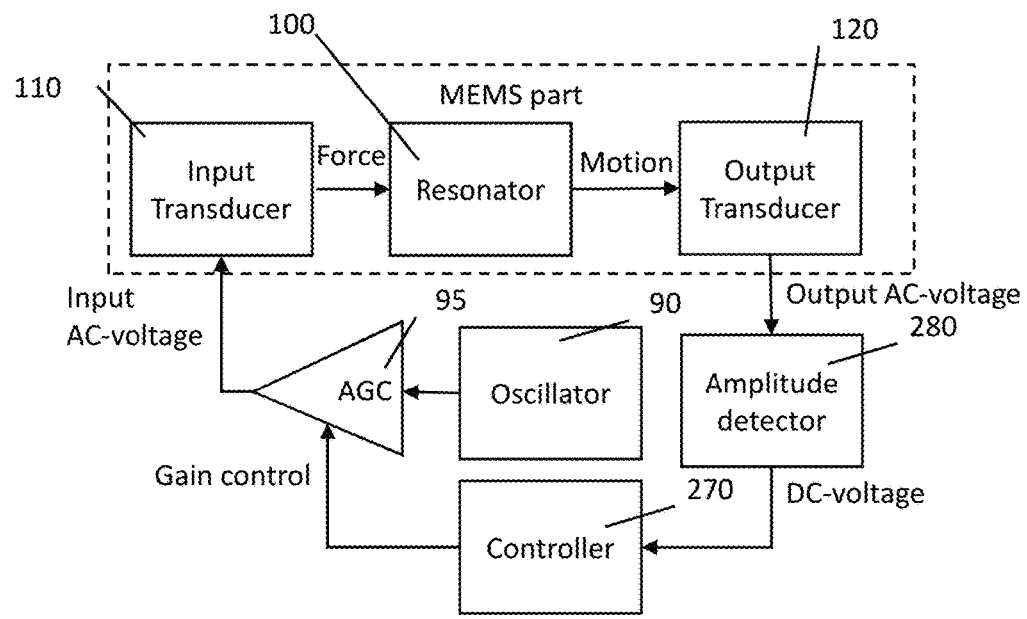
FIG. 2 illustrates a MEMS device with AGC feed-back loop.

In order to improve stabilization of the vibration amplitude in transient situations, a feed-back system may be introduced, that reduces the fluctuations illustrated in FIGS. 9 to 13 occurring if no stabilizing feed-back system is in place. A system according to FIG. 2 may be used in combination with driving the input transducer with an AC voltage having a frequency difference to the resonant frequency of the mechanical resonator. In this case the amplitude of the input AC voltage is not totally independent of the Q-value variation, but the dependency is still greatly reduced according to the previous analysis.

An improved stabilization can be achieved if the input transducer is driven with an AC-voltage having essentially constant amplitude independent on the Q-value variation of the resonator. In this improved system the stabilization feed-back circuitry shall actively change the frequency difference Δf to counteract the variation of the vibration amplitude. A direct feed-back to, for example, a voltage controlled oscillator is not possible, since for every desired mechanical oscillation amplitude level, there are two possible frequency difference Δf values. A positive or negative feed-back system would be confused, since the feed-back would need to be positive on one side and negative on the other side of the resonant frequency $f_0$. Thus, it is necessary to be able to distinguish on which side of the resonant frequency $f_0$ the resonator is vibrating and preferably, use only the frequency difference Δf values on one side of the resonant frequency $f_0$ for controlling the resonator amplitude.

One exemplary way to limit the used frequency difference Δf values to only one side of the resonance frequency $f_0$ in the resonance curve of FIG. 6 and thus to one of the two theoretically possible frequency difference Δf values without causing confusion in the feed-back system is to use the phase difference between the input AC voltage and the mechanical resonator oscillation as an additional control variable. The phase dependence of an input AC voltage and an output AC voltage due to polarity and amount of frequency difference Δf illustrated in FIG. 7 can be utilized for phase to frequency conversion. The phase shift of the input AC voltage with respect to the detected output AC voltage may be forced to a value range between 0 and π/2 or between π/2 and π, for operation below or above the resonant frequency $f_0$, respectively.

Figure 14:
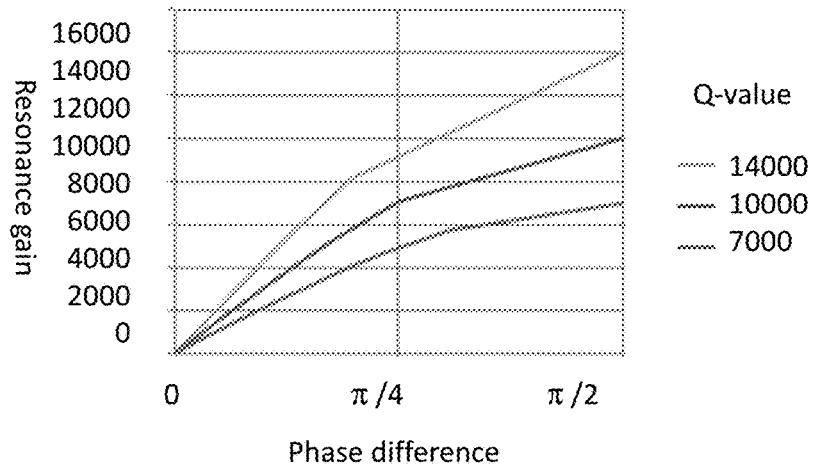
FIG. 14 is an illustration of resonance gain as function of a phase difference.

It can be noticed that phase shift to resonance gain relation is quite linear in the range of phase differences between 0 and π/4, or resonance gains below 70% of the maximum gain, as illustrated in FIG. 14. This relation between the phase difference and resonance gain is strongly dependent on the Q-value of the resonator, but this does not cause major problems since the exact value of the phase shift does not necessarily need to be known when negative feed-back is used.

Figure 15:
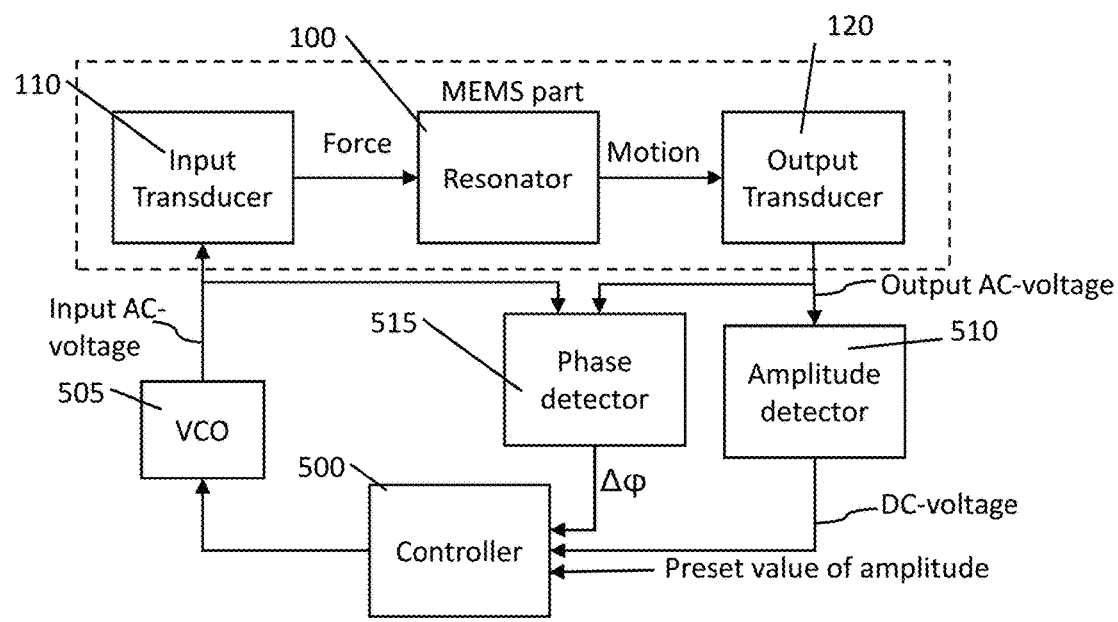
FIG. 15 illustrates a first embodiment of a MEMS sensor device with a drive loop circuitry.

FIG. 15 shows a first exemplary embodiment block diagram of a microelectromechanical sensor device with a MEMS part and a drive loop circuitry implementing the above disclosed inventive principles. The MEMS part comprises the mechanical resonator and functionality of input and output transducers. The block diagram illustrates functionalities of the MEMS part, but not the specific structure of the MEMS part. The input and/or output transducers may be partially physically separate from the resonator, for example in a capacitive transducer, or they may be part of the resonator structure, as for example in a piezoelectrical transducer. The MEMS part functionality may be disposed on the same chip with the drive loop circuitry, or it may be a separate chip electrically coupled with the drive loop circuitry. The essentially constant amplitude input AC-voltage from a voltage controlled oscillator VCO 505 is fed to the input transducer 110, which excites the mechanical resonator 100. Oscillation of the mechanical resonator 100 is detected with an output transducer 120, which provides at its output an output AC voltage corresponding to the resonator movement. The frequency and phase of the VCO 505 is adjusted by a controller 500, so that the input AC voltage has a set frequency difference Δf from the natural resonant frequency $f_0$ of the mechanical resonator. A phase detector 515 compares phases of the input AC voltage and the output AC voltage, and provides a phase difference information Δφ at its output. The controller 500 receives at one of its inputs the phase difference information Δφ between the input AC-voltage and the output AC voltage. In a second input of the controller 500, information on amplitude of the output voltage is received from an amplitude detector 510. The amplitude information may be provided in form of a DC-voltage. A skilled person knows that various types of signals may be provided by the amplitude detector 510 and the phase detector 515 for indicating the amplitude information and phase difference information Δφ respectively. For example, signals may be analog or digital, and signals may comprise voltage or current. A preset value of amplitude, which corresponds to a desired value of the amplitude of the mechanical resonator 100 motion in steady state oscillation is provided to the controller 500 through a control input. The controller 500 controls the frequency and phase of the VCO 505 in order to produce an amplitude stabilized oscillation of the mechanical resonator 100 with the preset amplitude value based on the phase difference information Δφ provided by the phase detector 515 and the detected amplitude information provided by the amplitude detector 510.

Figure 16:
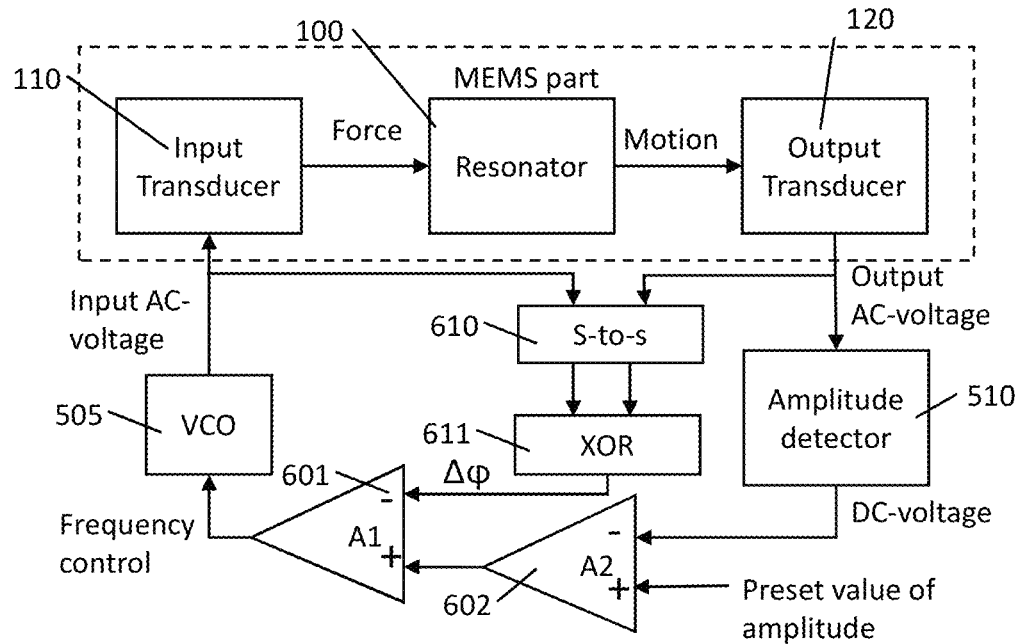
FIG. 16 illustrates a second embodiment of a MEMS sensor device with a drive loop circuitry.

FIG. 16 shows a second exemplary embodiment block diagram of a microelectromechanical sensor device with a MEMS part and a drive loop circuitry implementing the above disclosed inventive principles and which embodiment represents a more detailed exemplary implementation of the more general embodiment of FIG. 15. Control polarity of the VCO 505 is assumed positive: an increase in the control voltage will increase the frequency difference Δf. With this polarity selection, and for operation at frequency difference Δf below the resonant frequency $f_0$, the output of the XOR circuit 611 may be fed to the inverting input of a first amplifier A1 601. The essentially constant amplitude AC-voltage received from the voltage controlled oscillator VCO 505 is fed to the input transducer 110 for exciting the mechanical resonator 100. The frequency and phase of the VCO 505 is adjusted by the first amplifier A1 601, which feeds a controlling voltage towards the VCO 505. The VCO 505 generates the essentially constant amplitude input AC voltage to the input transducer 110. Thus, the VCO 505 is an exemplary embodiment of a drive circuit configured to generate the input AC voltage. Phase detector functionality illustrated with reference 515 in FIG. 15, is implemented with an exclusive or circuit XOR 611, which is preceded by sinusoidal-to-square wave conversion circuitry 610, which converts both received AC voltages. The phase detector circuitry (610, 611) will have a zero voltage output for phase difference Δφ equal to 0, a maximum voltage output for phase difference Δφ equal to π and it follows a linear law for phase differences in-between. Half of the maximum voltage is obtained for a phase difference equal to π/2. Information on amplitude of the output AC voltage is received from an amplitude detector circuitry 510 similarly to the first embodiment. The amplitude information may be provided in form of a DC-voltage. A preset value of amplitude, which corresponds to a desired value of the amplitude of the mechanical resonator 100 motion in steady state oscillation is provided to the non-inverting input of a second amplifier A2 602 through its non-inverting input, and the detected amplitude value is received at the inverting input of the second amplifier A2 602. Output of the second amplifier A2 602 is limited to voltages that correspond to a phase difference between 0 and π/2, or preferably to even smaller range of voltages corresponding to a phase difference between 0 and π/4, since in this phase difference range the desired stabilization of the capacitive coupling may be achieved with high precision. The output of the second amplifier A2 602 is fed to the non-inverting input of the first amplifier A1 601. Amplifications and frequency responses of the first (A1 601) and second (A1 602) amplifiers are selected such that the control system, i.e. the negative feed-back loop, is stable and has fast enough response for being able to cancel the amplitude variations of the mechanical vibration. The first amplifier A1 601 and the second amplifier A2 602 may be considered as an exemplary discrete circuitry implementation of the controller circuitry 500 of FIG. 15.

For operation with a frequency difference Δf above the resonant frequency $f_0$, the polarity of amplifier A2 602 may be changed so that the output of the amplitude detector is fed to the non-inverting input and the preset amplitude level is fed into the inverting input. Further, the output of the second amplifier A2 602 shall be limited to values corresponding to phase shift range between π/2 and π, or preferably to a narrower range between 3π/4 and π for good amplitude and capacitive coupling stabilization results.

Figure 17:
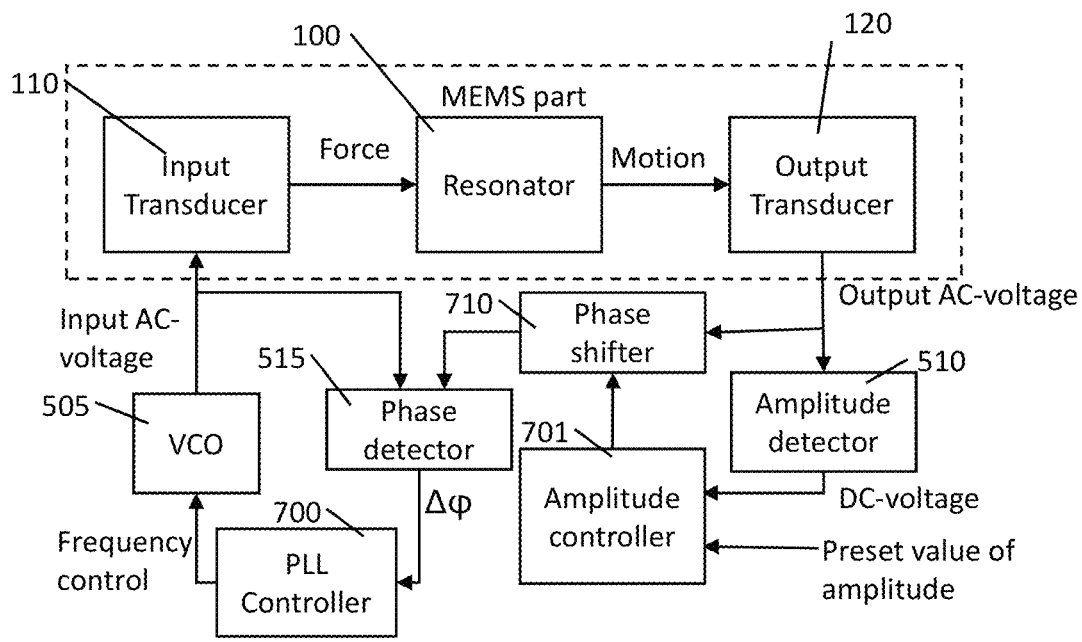
FIG. 17 illustrates a third embodiment of a MEMS sensor device with a drive loop circuitry.

FIG. 17 shows a third exemplary embodiment block diagram of a microelectromechanical sensor device with a MEMS part and a drive loop circuitry implementing the above disclosed inventive principles. The input AC-voltage from a voltage controlled oscillator VCO 505 is fed to the input transducer 110 of the mechanical resonator 100. Oscillation of the mechanical resonator 100 is detected with an output transducer 120, which provides at its output the output AC voltage corresponding to the resonator movement. The frequency of the VCO 505 is adjusted by a PLL controller 700. The PLL controller 700 receives at its input a phase difference information Δφ between the input AC-voltage and a phase shifted output AC voltage from the output transducer. The phase of the phase shifted output AC voltage is adjusted with a phase shifter circuitry 710. The phase shift is made adjustable over range from 0 to −π/2, or preferably over range from 0 to −π/4, if an operation frequency is selected that is below the resonant frequency $f_0$, in other words if the frequency difference Δf has a negative value. The phase shift is made adjustable over range from −π/2 to −π, or preferably over range from −3π/4 to −π, if an operation frequency is selected that is above the resonant frequency $f_0$, in other words if the frequency difference Δf has a positive value. Amplitude of the resonator 100 motion is controlled by an amplitude controller 701, that adjusts the amount of phase shift in the phase shifter 710 based on detected difference between the detected amplitude of the output AC voltage and an intended preset value of amplitude. The preset value of amplitude, which corresponds to a desired value of the amplitude of the mechanical resonator 100 motion in steady state oscillation is provided to the amplitude controller 701 through a control input.

Figure 18:
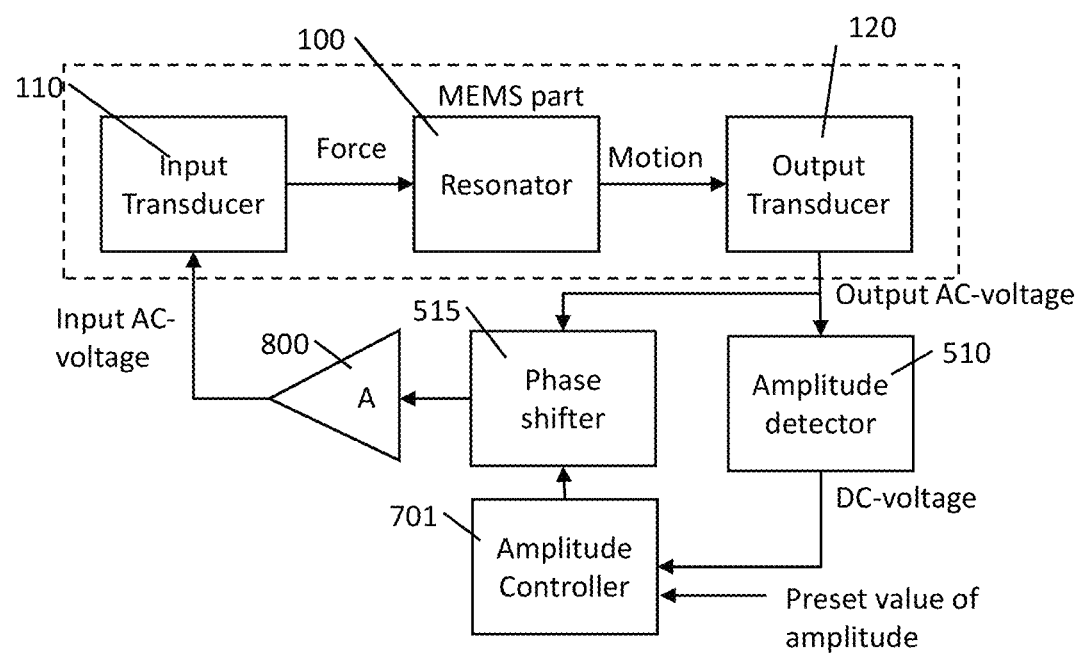
FIG. 18 illustrates a fourth embodiment of a MEMS sensor device with a drive loop circuitry.

FIG. 18 shows a fourth exemplary embodiment block diagram of a microelectromechanical sensor device with a MEMS part and a drive loop circuitry implementing the above disclosed inventive principles. A self-sustaining closed loop oscillator is provided with an amplifier A 800 and an adjustable phase shift by a phase shifter 515 in the feed-back part of the drive loop circuitry. The amplifier A 800 generates the input AC voltage to the input transducer 110, which amplitude of the input AC voltage will under steady state conditions approach the maximum value limited by the supply voltage of the amplifier or by any other known means of limiting an AC voltage to a maximum value. Thus, the amplifier A 800 is an exemplary embodiment of a drive circuit configured to generate the essentially constant amplitude input AC voltage. Amplitude is controlled by an amplitude controller 701 that adjusts the phase shift. Preset desired value of the amplitude is provided to the amplitude controller 701 through a control input. The amplitude controller 701 compares the detected amplitude value provided by an amplitude detector 501 to the desired preset value of amplitude, and controls the phase shifter 515 accordingly. This type of oscillator will start from the noise of the output amplifier 800, or from an artificially generated wide-band noise, which noise the mechanical resonator 100 will filter so that the output AC-voltage will contain a sinusoidal component. This component will be at the resonant frequency $f_0$ first when the oscillation amplitude starts to increase, but the control loop will adjust the phase shift generated by the phase shifter 515 and thus the frequency so that in steady state the oscillation shifts to a frequency different from the resonant frequency. Steady state frequency of the mechanical resonator 100 will in this embodiment equal a frequency at which sum of the phase difference between the input AC voltage and the output AC voltage and the phase shift by the phase shifter 515 equals n*2π, wherein n is an integer.

Figure 4:
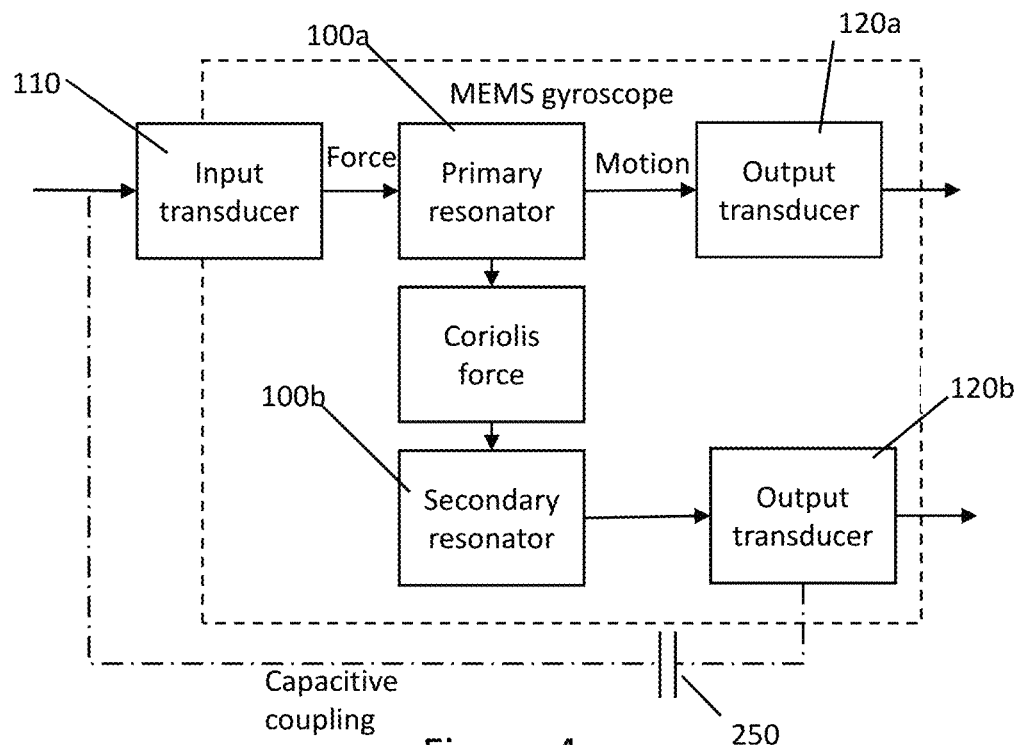
FIG. 4 illustrates capacitive coupling in a MEMS gyroscope.
Figure 5:
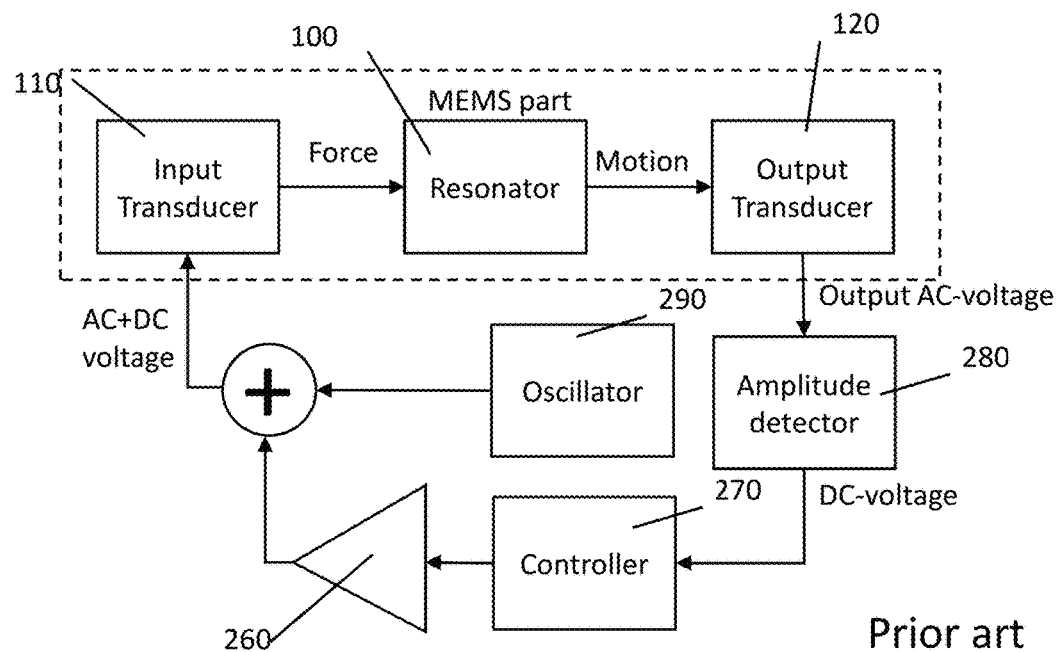
FIG. 5 illustrates a MEMS device using DC biasing.

In case the MEMS device of FIGS. 15 to 18 was a MEMS gyroscope, the resonator represents the primary resonator, the input transducer 110 may comprise the primary excitation transducer configured to provide an excitation force to the primary resonator of the gyroscope and the output transducer 120 may comprise the primary output transducer configured to provide electrical information corresponding to mechanical oscillation of the primary mechanical resonator of the gyroscope. In case the MEMS device of FIGS. 15 to 18 was an induction type magnetometer, the resonator represents the coil, the input transducer 110 may comprise the excitation transducer configured to provide an excitation force to resonate the coil of the magnetometer and the output transducer 120 may be configured to provide electrical information corresponding to mechanical oscillation of the coil of the magnetometer. In FIGS. 15 to 18, only those blocks of the device are shown that are needed for describing the invention. In addition to the presented blocks, the MEMS device may comprise further blocks and functions. For example, a gyroscope may comprise a secondary resonator and a secondary output transducer as shown for example in FIG. 4.

It is apparent to a person skilled in the art that as technology advanced, the basic idea of the invention can be implemented in various ways. The invention and its embodiments are therefore not restricted to the above examples, but they may vary within the scope of the claims.

What is claimed is:

1. A method for stabilizing amplitude of a mechanical vibration of a mechanical resonator in a microelectromechanical sensor device, the method comprising:
    exciting the mechanical resonator into the mechanical vibration with an oscillating excitation force by an input transducer; and
    driving the input transducer with an input AC voltage having an essentially constant amplitude, wherein the driving with the input AC voltage occurs at a frequency that deviates from the resonant frequency of the mechanical resonator by a first frequency difference, and wherein the first frequency difference is configured to stabilize the amplitude of the mechanical vibration.

2. The method of claim 1, wherein the method further comprises:
    causing the stabilizing by maintaining the amplitude of the mechanical vibration essentially at a pre-defined constant value by adjusting the first frequency difference.

3. The method of claim 2, wherein the method further comprises:
    providing an output AC voltage induced by the mechanical vibration;
    controlling the adjusting the first frequency difference on basis of a detected amplitude difference between a detected amplitude of the output AC voltage and a preset target amplitude value.

4. The method of claim 3, wherein the method further comprises:
    detecting a first phase difference between the input AC voltage and the output AC voltage;
    controlling the first frequency difference on basis of the first phase difference.

5. The method of claim 3, wherein the method further comprises:
    causing a phase shift to the output AC voltage, wherein the phase shift produces a phase shifted output AC voltage.

6. The method of claim 5, wherein the method further comprises:
    detecting a second phase difference between the phase shifted output AC voltage and the input AC voltage; and
    controlling of the first frequency difference on the basis the second phase difference.

7. The method of claim 5, wherein the method comprises:
    generating the input AC voltage by amplifying the phase shifted output AC voltage.

8. The method of claim 1, wherein the method comprises:
    generating the input AC voltage by a voltage controlled oscillator.

9. The method of claim 1, wherein the microelectromechanical sensor device comprises any one of a gyroscope and an induction type magnetometer.

10. The method of claim 1, wherein the first frequency difference is between +/−0.0001 and +/−0.001 times the resonant frequency.

11. A microelectromechanical sensor device comprising:
    a mechanical resonator,
    a drive loop circuitry for stabilizing amplitude of a mechanical vibration of the mechanical resonator, and
    an input transducer configured to excite the mechanical resonator into the mechanical vibration with an oscillating excitation force,
    wherein the drive loop circuitry is configured to drive the input transducer with an input AC voltage having an essentially constant amplitude, and wherein the driving with the input AC voltage is configured to occur at a frequency that deviates from a resonant frequency of the mechanical resonator by a first frequency difference, and wherein the first frequency difference is configured to stabilize the amplitude of the mechanical vibration.

12. The microelectromechanical sensor device of claim 11, wherein the drive loop circuitry further comprises:
    a feed-back circuitry configured to cause the stabilizing by maintaining the amplitude of the mechanical vibration of the mechanical resonator at a desired constant value by adjusting the first frequency difference.

13. The microelectromechanical sensor device of claim 12, further comprising:
    an output transducer configured to provide an output AC voltage induced by the mechanical vibration; and
    wherein the feed-back circuitry comprises:
        an amplitude control circuitry configured to control the adjusting the first frequency difference on basis of a detected amplitude of the output AC voltage and a preset target amplitude value.

14. The microelectromechanical sensor device of claim 13, wherein the feed-back circuitry further comprises:
    a phase detecting circuitry configured to detect a first phase difference between the input AC voltage and the output AC voltage; and
    a controller circuitry configured to control the first frequency difference on basis of the first phase difference.

15. The microelectromechanical sensor device of claim 13, wherein:
    the amplitude control circuitry is configured to cause a phase shift to the output AC voltage, wherein the phase shift produces a phase shifted output AC voltage.

16. The microelectromechanical sensor device of claim 15, wherein the feed-back circuitry further comprises:
    a phase detecting circuitry configured to detect a second phase difference between the phase shifted input AC voltage and the output AC voltage; and
    a PLL controller circuitry configured to control the adjustment of the first frequency difference on basis of the second phase difference.

17. The microelectromechanical sensor device of claim 15, wherein the drive loop circuitry comprises an amplifier configured to generate the input AC voltage by amplifying the phase shifted output AC voltage.

18. The microelectromechanical sensor device of claim 11, wherein the drive loop circuitry comprises a voltage controlled oscillator configured to generate said input AC voltage.

19. The microelectromechanical sensor device of claim 11, wherein the microelectromechanical sensor device is any one of a gyroscope and an induction type magnetometer.

20. The microelectromechanical sensor device of claim 11, wherein the first frequency difference is between +/−0.0001 and +/−0.001 times the resonant frequency.

* * * * *